(12) United States Patent
Lin et al.

(10) Patent No.: US 8,138,509 B2
(45) Date of Patent: Mar. 20, 2012

(54) LIGHT EMITTING DEVICE HAVING LUMINESCENT LAYER WITH OPENING TO EXPOSED BOND PAD ON LIGHT EMITTING DIE FOR WIRE BONDING PAD TO SUBSTRATE

(75) Inventors: Tzy-Ying Lin, Hsinchu (TW); Chun-Chiang Yen, Hsinchu (TW); Wu-Cheng Kuo, Hsinchu (TW)

(73) Assignee: VisEra Technologies Company, Limited, Hsinchu (TW)

( * ) Notice: Subject to any disclaimer, the term of this patent is extended or adjusted under 35 U.S.C. 154(b) by 410 days.

(21) Appl. No.: 12/395,086

(22) Filed: Feb. 27, 2009

(65) Prior Publication Data

US 2010/0219433 A1 Sep. 2, 2010

(51) Int. Cl.
*H01L 33/36* (2010.01)
(52) U.S. Cl. ........ 257/88; 257/98; 257/99; 257/E33.066
(58) Field of Classification Search ............ 257/E33.066
See application file for complete search history.

(56) References Cited

U.S. PATENT DOCUMENTS

| 7,851,331 B2* | 12/2010 | Lu et al. .................. 438/459 |
| 2002/0185965 A1* | 12/2002 | Collins et al. .................. 313/501 |
| 2004/0169181 A1 | 9/2004 | Yoo |
| 2006/0138435 A1* | 6/2006 | Tarsa et al. ...................... 257/89 |
| 2008/0224162 A1* | 9/2008 | Min et al. ........................ 257/98 |
| 2009/0057701 A1* | 3/2009 | Chao ............................... 257/98 |

FOREIGN PATENT DOCUMENTS

| CN | 201133610 | 10/2008 |
| WO | WO 2007/023412 A2 * | 3/2007 |

* cited by examiner

*Primary Examiner* — Stephen W Smoot
(74) *Attorney, Agent, or Firm* — Muncy, Geissler, Olds & Lowe, PLLC (57) ABSTRACT

Light emitting devices conformally covered by a luminescent material layer are presented. A light emitting device includes a semiconductor light emitting die attached to a substrate. At least one bond pad is disposed on the semiconductor light emitting die. A luminescent material layer conformally covers the semiconductor light emitting die, wherein the luminescent material layer has at least one opening corresponding to and exposing the at least one bond pad. At least one wirebond is electrically connected to the at least one bond pad and a contact pad on the substrate.

11 Claims, 12 Drawing Sheets

LIGHT EMITTING DEVICE HAVING LUMINESCENT LAYER WITH OPENING TO EXPOSED BOND PAD ON LIGHT EMITTING DIE FOR WIRE BONDING PAD TO SUBSTRATE

BACKGROUND OF THE INVENTION

1. Field of the Invention

The invention relates to phosphor-converting white light emitting devices, and more particularly to a light emitting device uniformly and conformally covered by a luminescent material layer.

2. Description of the Related Art

Phosphor-converting white light-emitting diodes (LEDs) adapt a separated phosphor coating layer from a blue LED chip to produce light emitting devices which emit white light, i.e., light emitting devices in which a blue LED is disposed in a reflective cup and is surrounded by material including phosphors. A portion of the blue light emitted by the LED is absorbed by the phosphors, which in response emit red and green light. The combination of the unabsorbed blue light emitted by the LED and the red and the green light emitted by the phosphors can appear white to the human eye.

Figure 1:
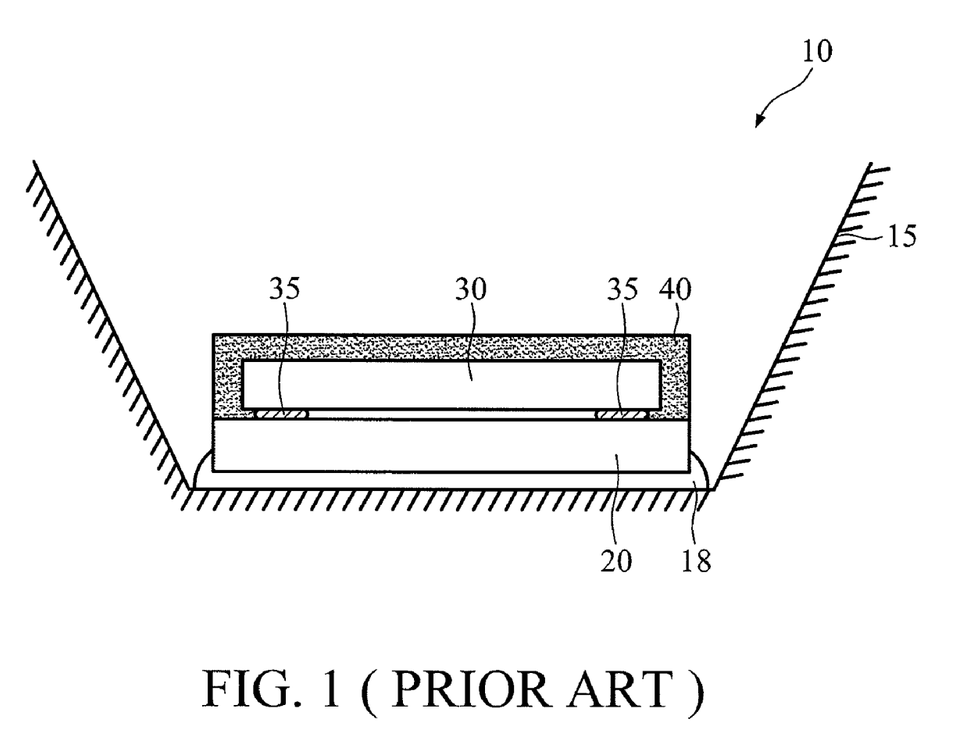
FIG. 1 is a schematic view of a conventional phosphor-converting white light-emitting diode.

FIG. 1 is a schematic view of a conventional phosphor-converting white light-emitting diode. Referring to FIG. 1, a phosphor-converting white LED 10 includes a blue light emitting diode chip 30 oriented in a flip chip arrangement on a substrate 20. The light emitting diode chip 30 is electrically connected to the substrate 20 through ball grid bonds 35. A phosphor layer 40 is formed overlying the package of the light emitting diode chip 30 on the substrate 20. The package is attached to a reflector cup 15 by an adhesive 18. Conventional methods adapt applying a phosphor particle containing resin on the blue LED. The phosphor particle is then uniformly deposited onto the interface of the blue LED. Uniform deposition of the phosphor particle, however, is very difficult to be implemented. Thus, non-uniform deposited phosphor surrounding LEDs frequently emit white light in a central cone surrounded by annular rings of yellow and blue light, rather than a uniform white spatial profile.

Figure 2A:
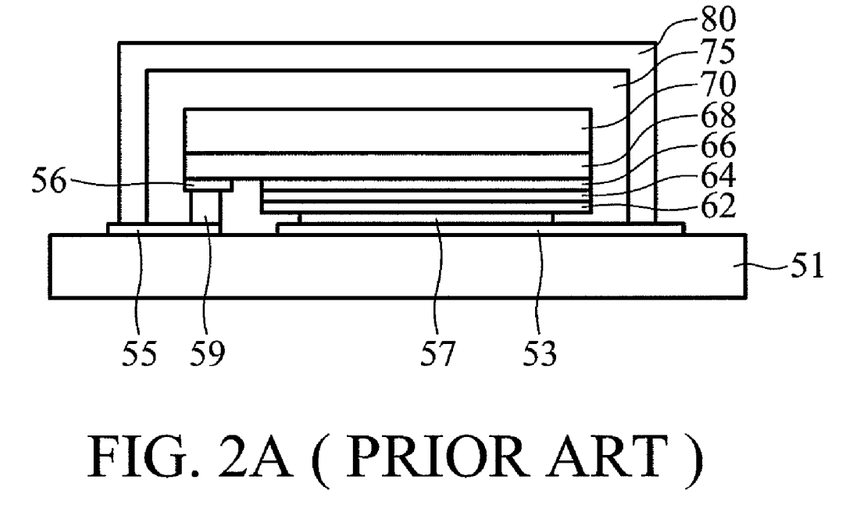
FIG. 2A is a schematic cross section of a conventional light emitting diode before stenciling with a phosphor layer.

U.S. Pat. No. 6,650,044, the entirety of which is hereby incorporated herein by reference, discloses a light emitting device with a stenciled phosphor layer on an LED chip which is oriented in a flip chip arrangement. FIG. 2A is a schematic cross section of a conventional light emitting diode after stenciling with a phosphor layer. In FIG. 2A, a light emitting device includes a first semiconductor layer 68 of a first conductivity type and a second semiconductor layer 64 of a second conductivity type. The semiconductor layers 68 and 64 are electrically coupled to an active region 66. The active region 66 is, for example, a p-n junction associated with the interface of layers 68 and 64. An optional transparent cap 70 is disposed on the semiconductor layer 68. The contacts 56 and 62 are electrically coupled to the semiconductor layers 68 and 64, respectively. The interconnects 59 and 57 electrically couple the contacts 56 and 62 to the substrate contacts 55 and 53, respectively. The light emitting device is attached onto a substrate 51 in a flip chip arrangement. A transparent layer 75 is formed overlying the light emitting device and a phosphor layer 80 is stenciled on the transparent layer 75.

Figure 2B:
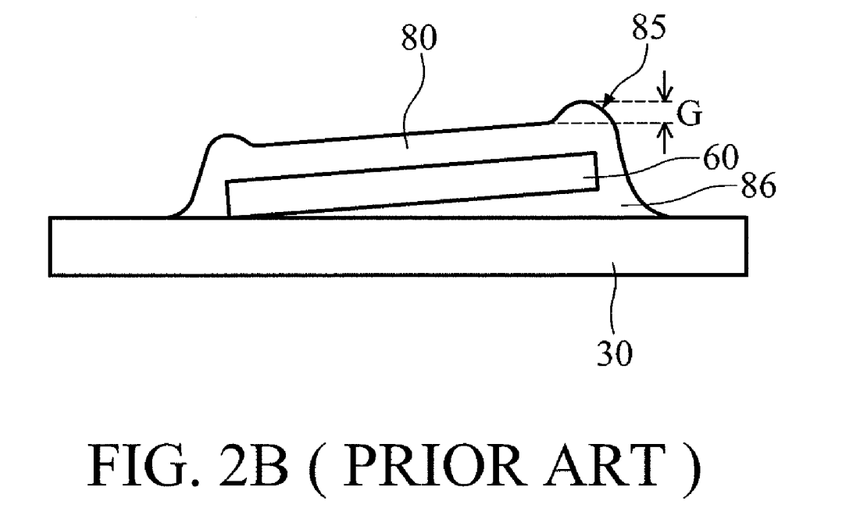
FIG. 2B shows a bulge and a trail formed during a conventional stenciling process when the flip chipped LED is misaligned or tilted.

Conventional flip chip packages, however, are typically costly and less reliable than conventional wire-bond packages. Particularly, when a flip chip LED 60 is misaligned or tilted, a bulge 85 and a trail 86 may be formed during the stenciling process or as the stencil is removed, as shown in FIG. 2B. Therefore, additional care must be taken to avoid generation of bulges or trails that would lead to an uneven attachment of the flip chip LED on a substrate. Uneven stenciled phosphor layers can results in non-uniform color correlated temperature (CCT) and deteriorate reliability.

Accordingly, a light emitting device, with uniform deposited phosphor layers and without results of bonded connection problems is desired.

BRIEF SUMMARY OF THE INVENTION

The invention is directed to light emitting devices conformally covered by a luminescent material layer. Wire-bond packaging technology has been adapted to reduce production cost and improve reliability.

An embodiment of the invention provides a light emitting device, comprising: a semiconductor light emitting die attached to a substrate; at least one bond pad on the semiconductor light emitting die; a luminescent material layer conformally covering the semiconductor light emitting die, wherein the luminescent material layer has at least one opening corresponding to and exposing the at least one bond pad; and at least one wirebond electrically connecting the at least one bond pad and a contact pad on the substrate.

An embodiment of the invention further provides another light emitting device, comprising: an array of semiconductor light emitting dies attached to a substrate; at least one bond pad on each semiconductor light emitting die in the array; a luminescent material layer conformally covering the array of semiconductor light emitting dies, wherein the luminescent material layer has at least one opening corresponding to and exposing the at least one bond pad; and at least one wirebond electrically connecting the at least one bond pad and a contact pad on the substrate.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3A:
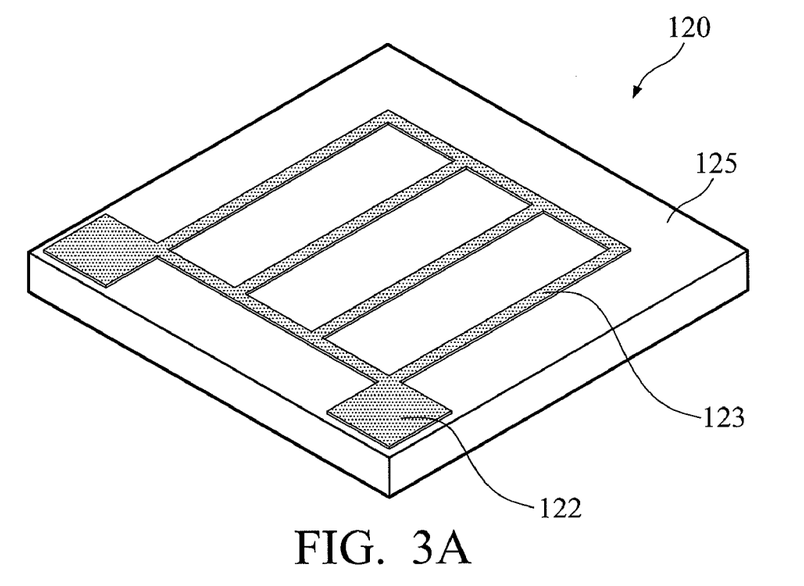
FIGS. 3A-3B are perspective views showing an embodiment of an LED die of the invention.
Figure 3B:
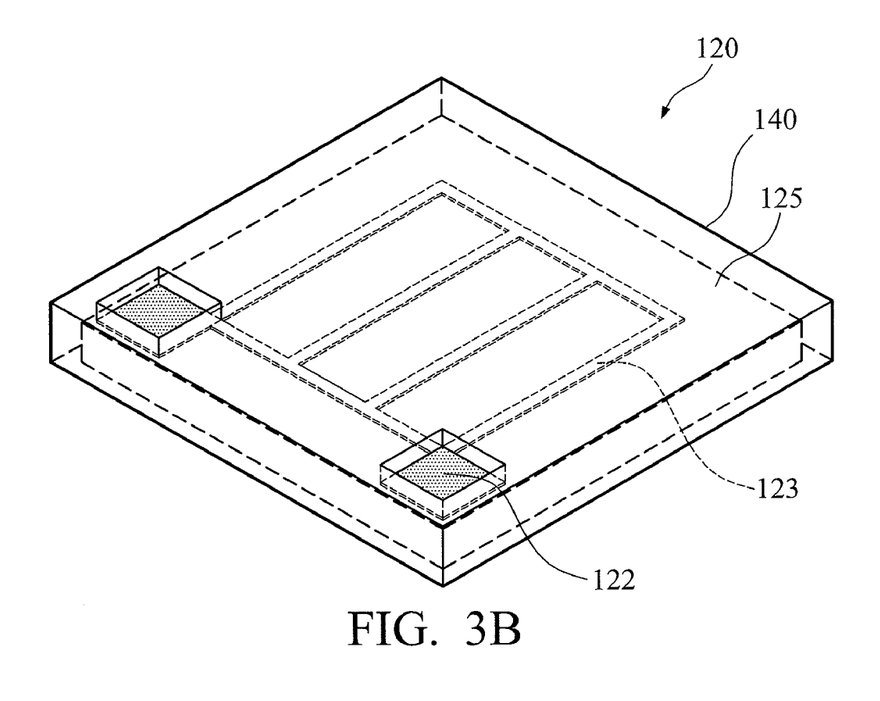

FIG. 3A is a perspective view showing an embodiment of an LED die of the invention. The LED die 120 may comprise a blue light LED die. In FIG. 3A, an LED die 120 includes a semiconductor base 125 with an active region therein. An electrode pattern 123 is formed on the top surface of the semiconductor base 125. The electrode pattern 123 can be redistributed and connected to bond pads 122. A phosphor layer or luminescent material layer 140 conformally covers the LED die 120 with openings exposing the bond pads 122, as shown in FIG. 3B. The luminescent material layer 140 comprises phosphor particles that convert light of a wavelength emitted by the light emitting die to at least another wavelength. More specifically, the light emitting die emits blue light, wherein the luminescent material layer includes phosphors that convert a portion of the blue light to yellow light combinable with a remaining portion of the blue light to produce white light. At least one wirebond (not shown) electrically connects the bond pads 122 to the contact pad on the substrate.

The LED die 120 can have both an anode and cathode on the top surface of the semiconductor base. Alternatively or optionally, the LED die can have can have an anode on the back of the semiconductor base and at least one cathode on the top surface of the semiconductor base. Contrarily a cathode on the back and an anode on the top surface is also ok.

Figure 4:
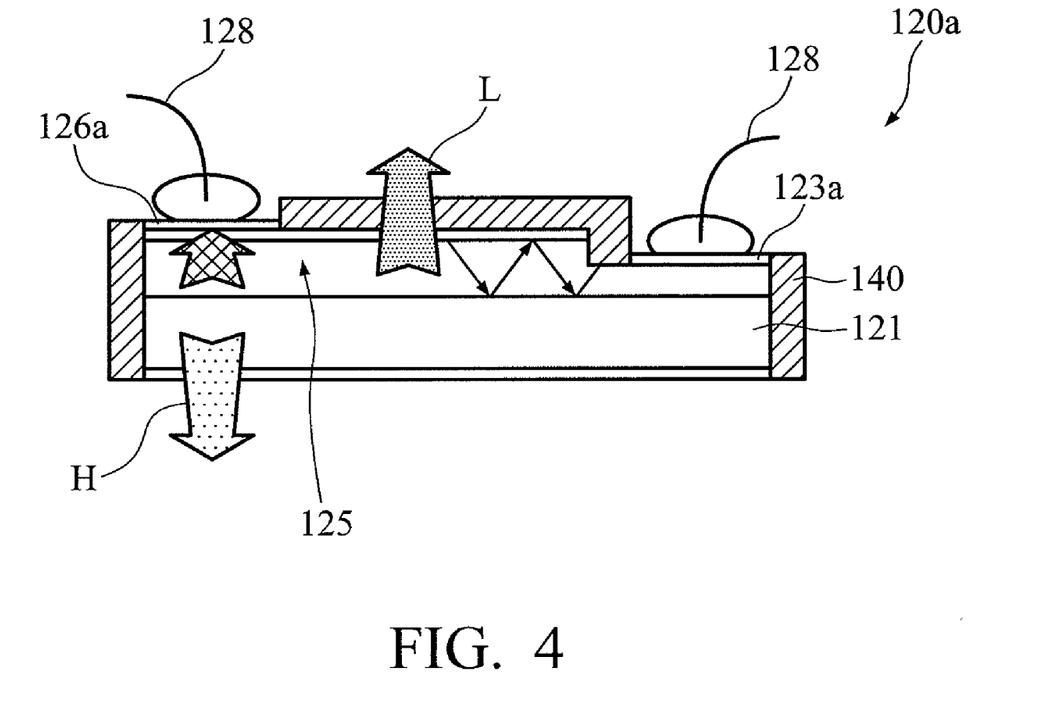
FIG. 4 is a cross section schematically showing the light emitting diode die which is a horizontally arranged LED die having both a cathode and an anode on the top surface of an active region of the semiconductor base.

FIG. 4 is a cross section schematically showing the light emitting diode die which is a horizontally arranged LED die 120a having both a cathode 126a and an anode 123a on the top surface of an active region of the semiconductor base 125 (such as GaN). An insulation base 121 such as sapphire is disposed on the bottom of the semiconductor base 125. According to another embodiment of the invention, the horizontally arranged LED optically includes a reflector underlying the insulation base. A luminescent material layer 140 is uniformly and conformally disposed to cover the horizontally arranged LED die 120a with openings exposing bond pads. Specifically, the top surface and side walls are covered by the luminescent material layer 140. Wirebonds 128 electrically connect the bond pads to contact pads on the substrate. The semiconductor base 125 with active region can be composed of 111-Nitride based compounds such as $Al_xIn_yGa_{1-x}N$ compounds, and the active region emits UV light or blue light at a wavelength of, for example, about 470 nm.

Figure 5:
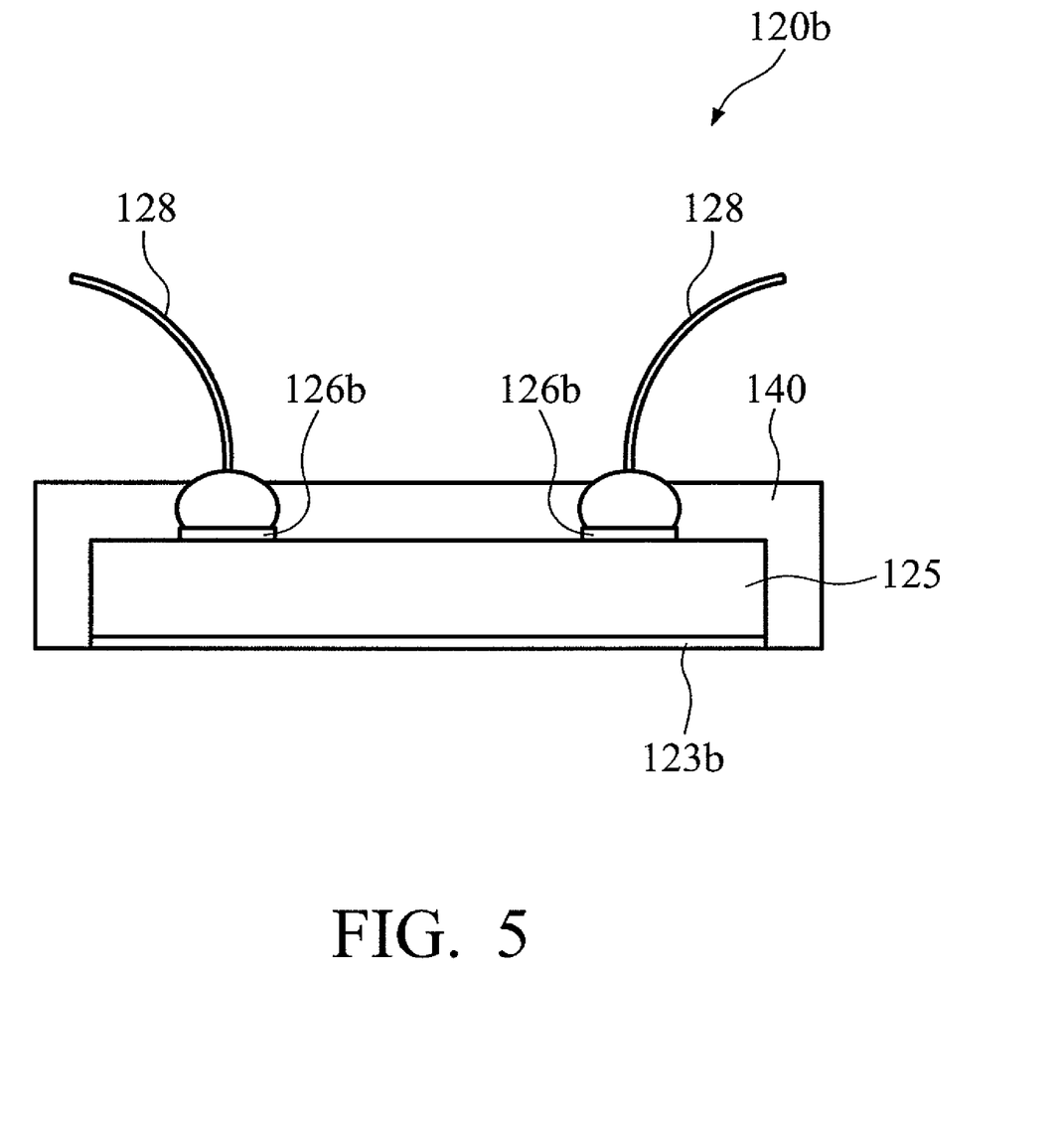
FIG. 5 is a cross section schematically showing the light emitting diode die which is a vertically arranged LED die having cathodes on the top surface of an active region of the semiconductor base and an anode on the bottom of the active region.

FIG. 5 is a cross section schematically showing the light emitting diode die which is a vertically arranged LED die 120b having cathodes 126b on the top surface of an active region of the semiconductor base 125 and an anode 123b on the bottom of the active region. A luminescent material layer 140 is uniformly and conformally disposed to cover the vertically arranged LED die 120b with openings exposing bond pads. Wirebonds 128 electrically connect the bond pads to contact pads on the substrate.

Figure 6:
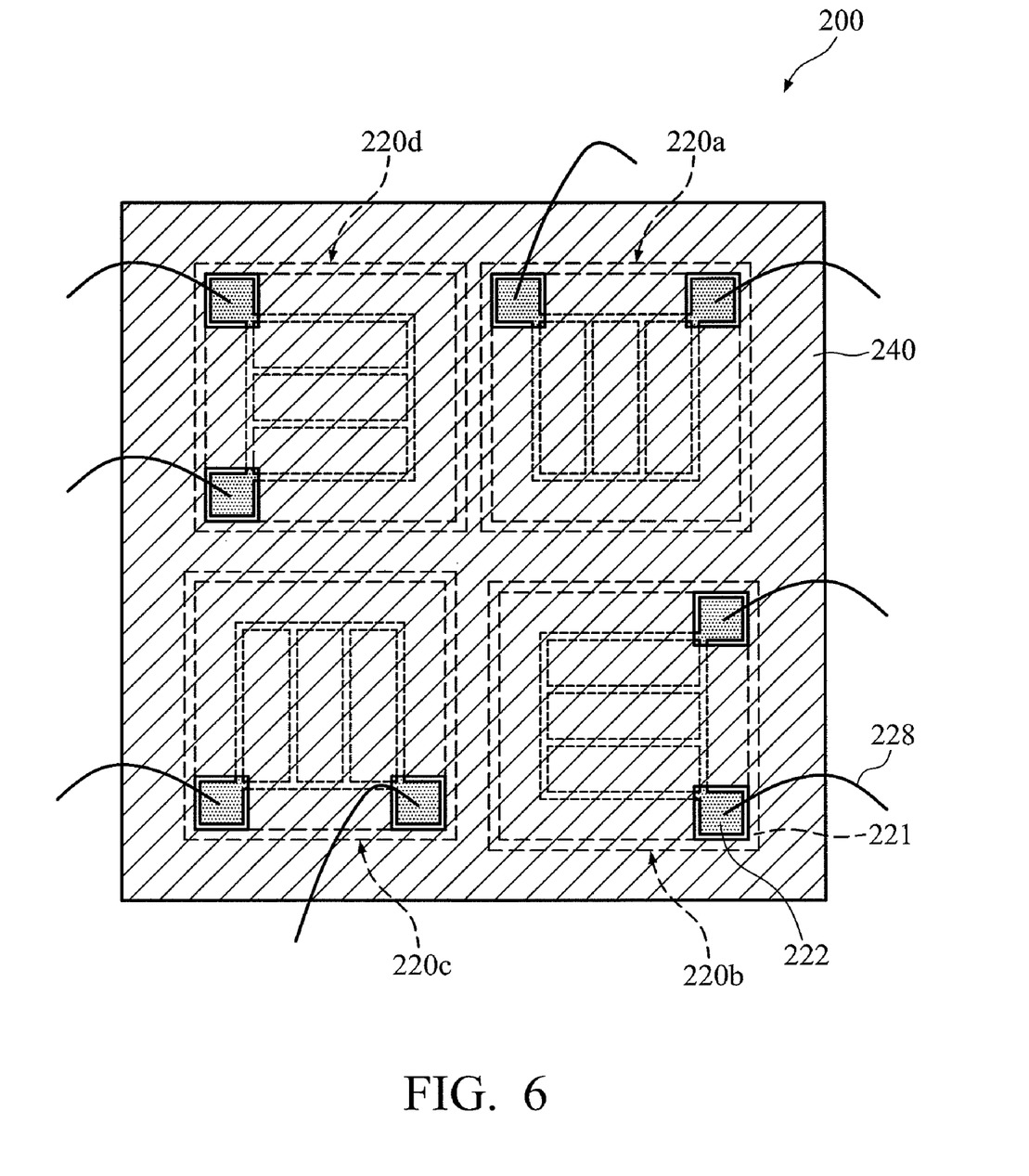
FIG. 6 is a plan view schematically illustrating an embodiment of an array of LED dies attached to a substrate.

FIG. 6 is a plan view schematically illustrating an embodiment of an array of LED dies attached to a substrate. In FIG. 6, an array of LED dies 220a-220d is arranged on the substrate. A luminescent material layer 240 uniformly and conformally covers the array of LED dies 220a-220d with openings 221 exposing the bond pads 222. Wirebonds 228 electrically connect the bond pads to contact pads on the substrate. The orientations of the LED dies 220a-220d can be different for different bonding wire connections. Note that for clarity, 4 LED dies 220a-220d are depicted in FIG. 6. More or fewer than 4 LED dies may also be disposed on the substrate. Furthermore, the array of LED dies can be packaged on a wafer-level substrate.

Figure 7A:
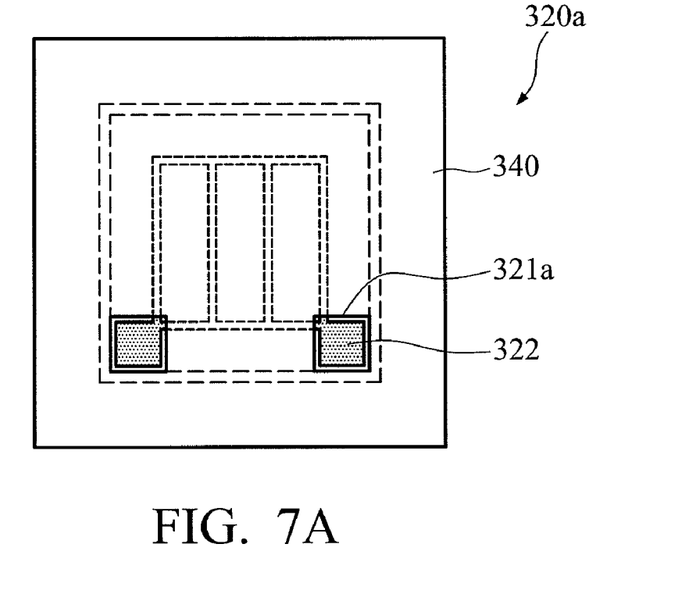
FIGS. 7A-7D schematically show various embodiments of the phosphor layers covering the LED dies with a trench connecting to the opening.
Figure 7B:
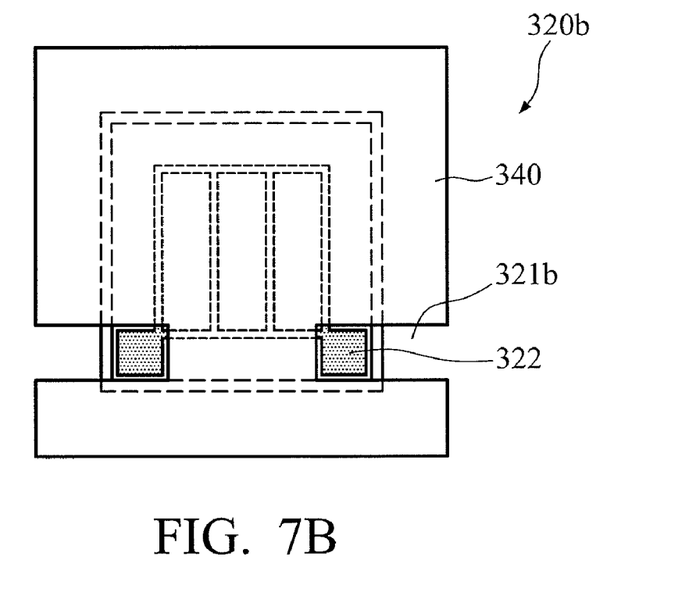
Figure 7C:
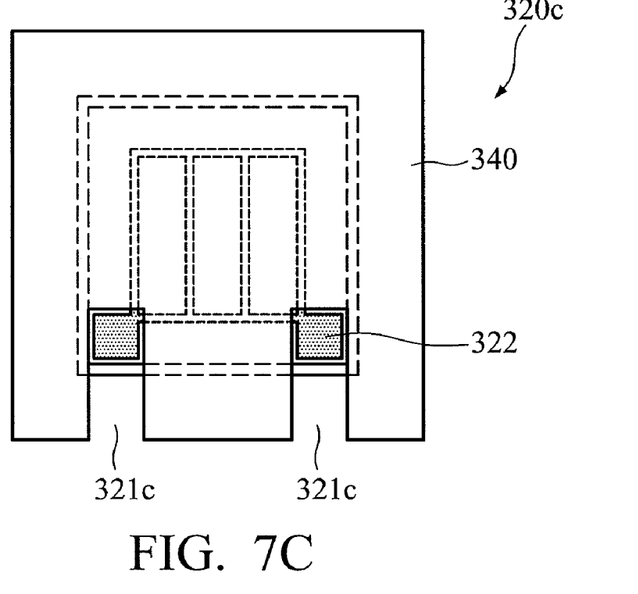
Figure 7D:
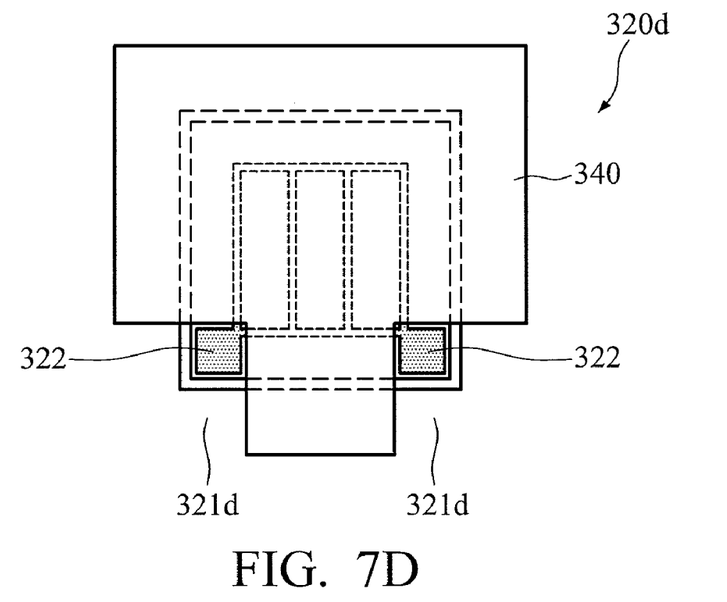

FIGS. 7A-7D schematically show various embodiments of the phosphor layers covering the LED dies with a trench connecting to the opening. In FIG. 7A, the light emitting devices 320a include a luminescent material layer 340 uniformly and conformally covering the LED die with openings 321a corresponding to and exposing the bond pads 322. In FIG. 7B, the light emitting devices 320b includes a luminescent material layer 340 uniformly and conformally covering the LED die with openings 321b horizontally extending and exposing the bond pads 322. In FIG. 7C, the light emitting devices 320c includes a luminescent material layer 340 uniformly and conformally covering the LED die with openings 321c vertically extending and exposing the bond pads 322. In FIG. 7D, the light emitting devices 320d includes a luminescent material layer 340 uniformly and conformally covering the LED die with enlarged openings 321d exposing the bond pads 322.

Figure 8:
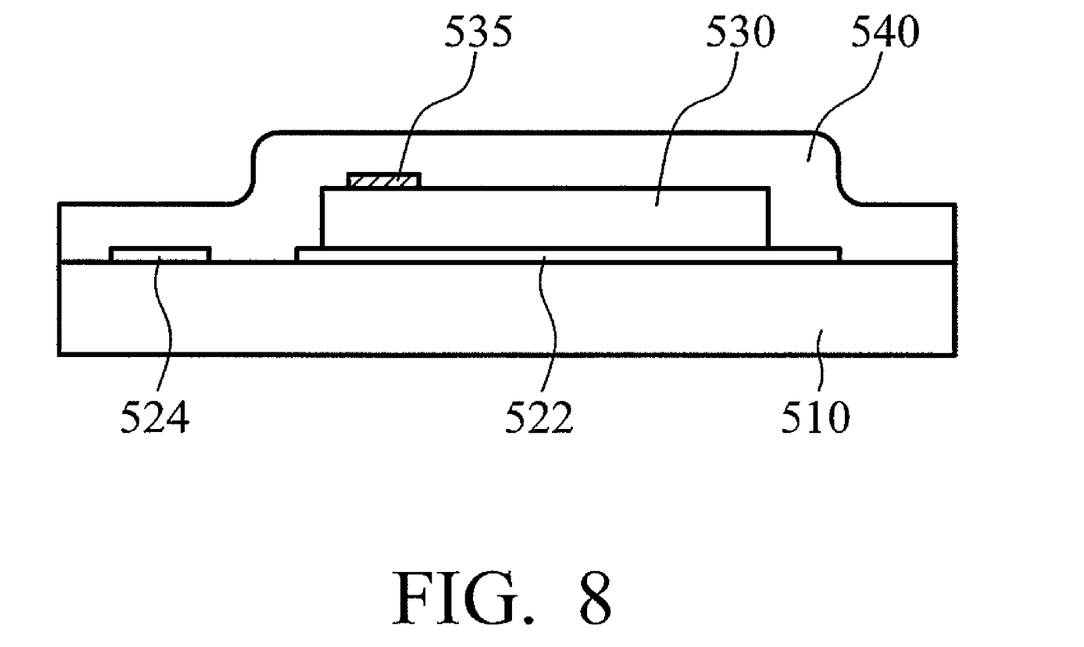
FIGS. 8, 9A, 9B, 10A, 10B, 11, and 12 schematically illustrate the etch fabrication steps for forming a phosphor layer conformally covering the LED dies.

FIGS. 8-12 schematically illustrate the etch fabrication steps for forming a phosphor layer conformally covering the LED dies. Referring to FIG. 8, a blue LED die 530 is attached to a die pad 522 of a substrate 510. The blue LED die 530 includes at least one bond pad 535 on the top surface of the LED die 530. At least one contact pad 524 is disposed on the substrate 510. A photoresist layer 540 is formed covering the substrate 510.

Figure 9A:
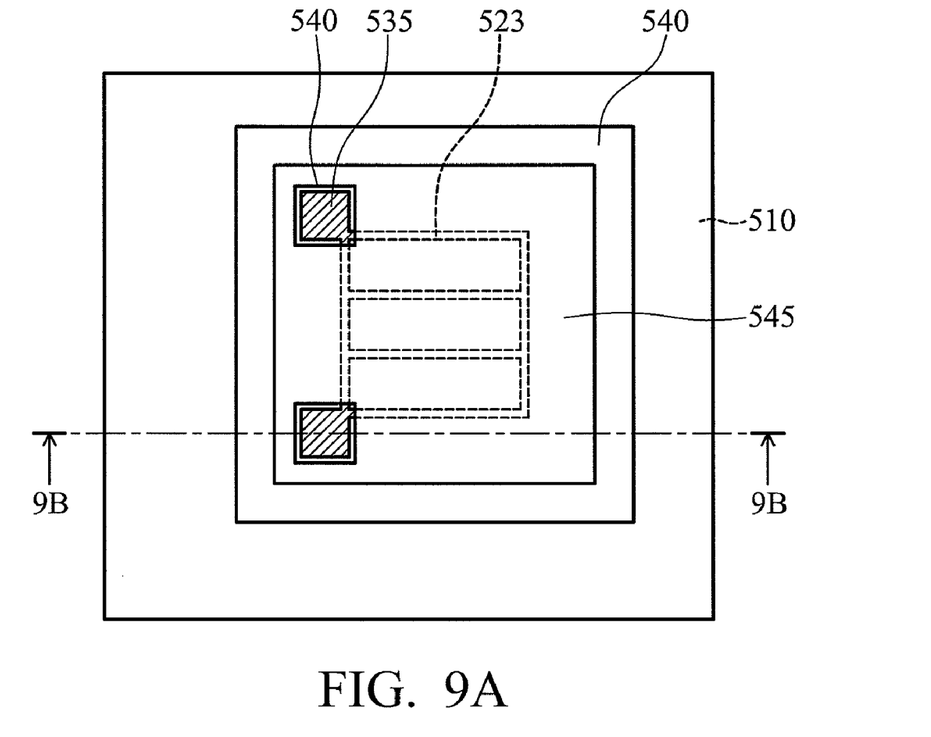
Figure 9B:
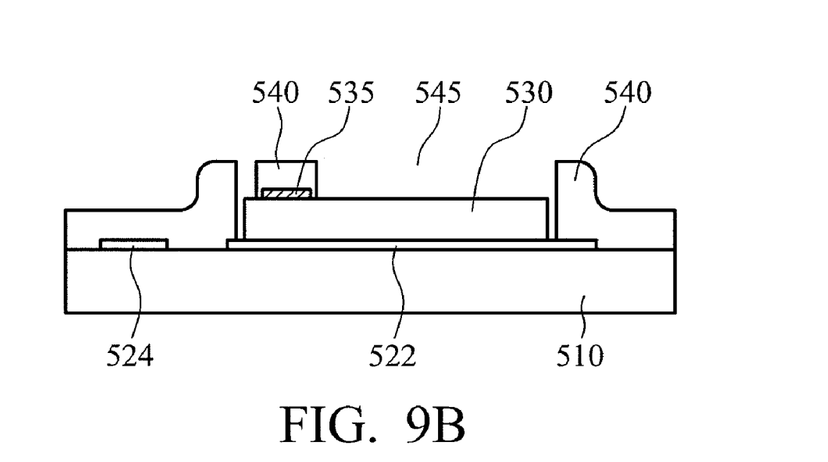

FIG. 9A is plan view of the LED die covered with a patterned photoresist layer. FIG. 9B is a cross section taken along cutting line 9B-9B. Referring to FIG. 9B, the photoresist layer 540 is lithographically patterned with an area 545 exposing the top surface and side walls of the LED die 530. Note that the bond pad 535 is covered with the photoresist layer.

Figure 10A:
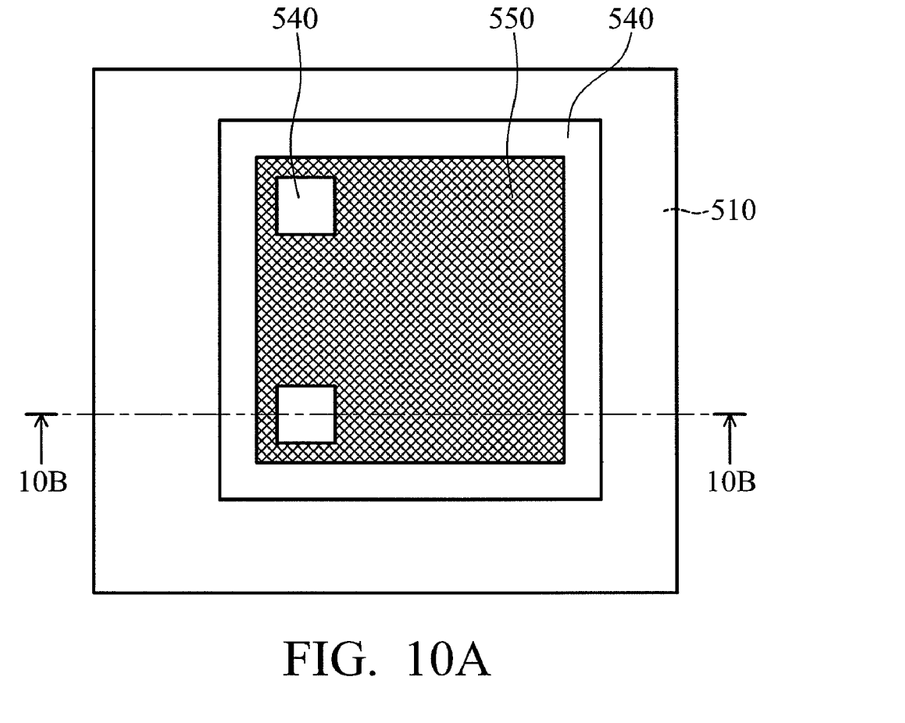
Figure 10B:
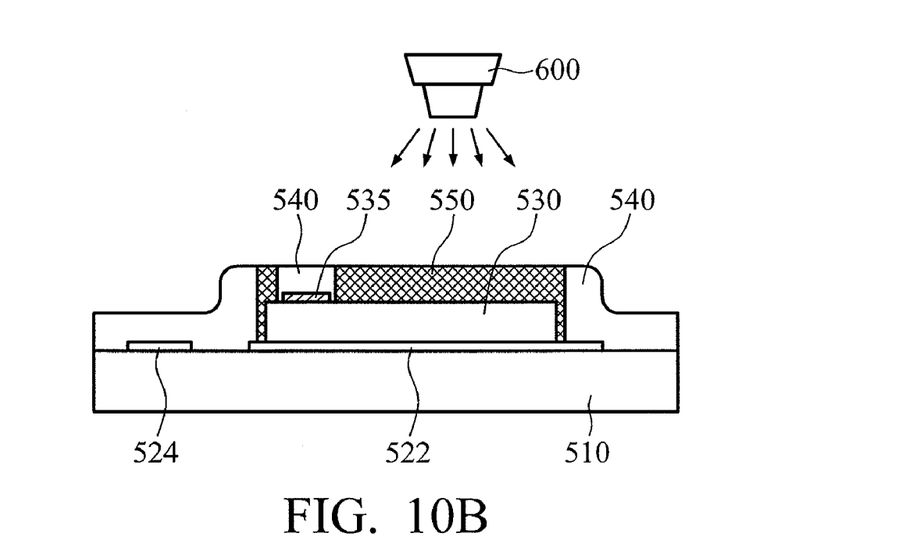

FIG. 10A is plan view illustrating the exposed area filled with a luminescent material layer uniformly and conformally covering the LED die. FIG. 10B is a cross section taken along cutting line 10B-10B. Referring to FIG. 10B, a curable luminescent composition 550, such as the phosphor containing composition is dispensed in the exposed area 545. For example, a dispenser head 600 is positioned above the substrate, dispensing a luminescent composition on the exposed area 545 to form a phosphor layer uniformly and conformally covering the top surface and sidewalls of the LED die 530. The dispensing process can be performed by a conventional high precision dispensing machine. The luminescent composition is then cured into a phosphor layer for example, by application of heat or ultraviolet radiation. The curing process can involve, for example, cross-linking of polymeric material in the phosphor layers.

In another embodiment of the invention, the curable luminescent composition is alternatively disposed in the exposed area with a squeegee drawn across the surface of the patterned photoresist layer. In further another embodiment of the invention, the curable luminescent composition can be deposited in the exposed area by thin-film or thick-film fabrication techniques.

It should be understood that the luminescent material layer includes the phosphor powder mixed with a conventional curable silicone composition, e.g., a powder of $(Y,Gd)_3Al_5O_{12}$:Ce (gadolinium and cerium doped yttrium aluminum garnet) particles, or other phosphor materials that may absorb light of wavelengths from about 430 nanometers (nm) to about 490 nm, and emit light in a broad band from about 510 nm to about 610 nm.

Figure 11:
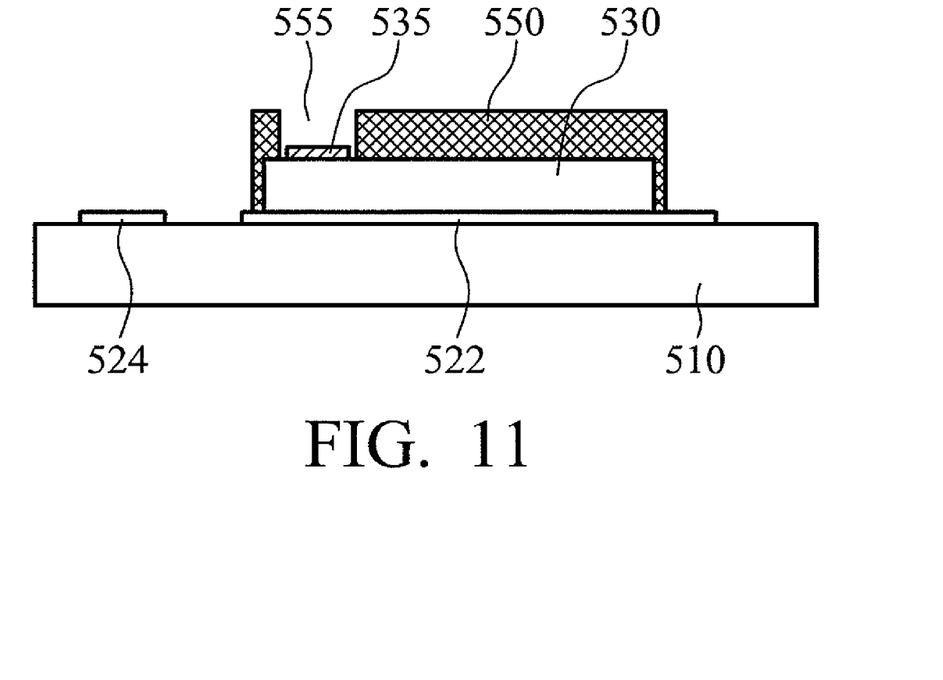

The patterned photoresist layer is then removed from the substrate, leaving phosphor layers, disposed over and around the LED die, as shown in FIG. 11. The patterned photoresist can be removed from the substrate using conventional etching or stripping methods. The profiles of the luminescent material layer can be adjusted according optical performance requirements. For example, a thickness X of the luminescent material layer on the top of the light emitting die equals to a thickness Y of the luminescent material layer on the sidewall of the light emitting die. Alternatively, a thickness X on the top of the light emitting die can be different from a thickness Y on the sidewall of the light emitting die. Dimensions of the luminescent material layer denoted X and Y both range from about 50 μm to about 250 μm.

Figure 12:
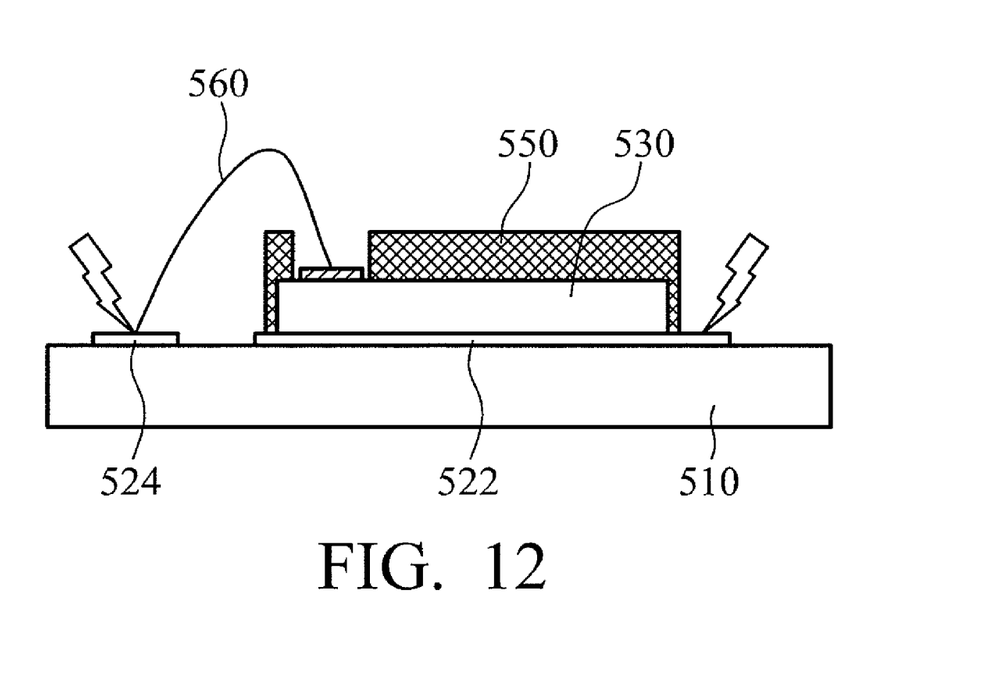

Referring to FIG. 12, one or more wirebonds 560 are formed which electrically couple electrodes or contact pads 535 on the surface of the LED die to contacts on the substrate 510.

Accordingly, light emitting device uniformly and conformally covered by a luminescent material layer of the invention are fabricated by a wafer-level scale and lithographically coated with phosphor layers for reliability and lower cost.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting device, comprising:
   an array of light emitting diode dies attached to a substrate, wherein the orientations of each of the light emitting diode dies are different;
   at least one bond pad on each of the light emitting diode dies in the array;
   a luminescent material layer conformally covering the array of light emitting diode dies, wherein the luminescent material layer has at least one opening corresponding to and exposing the at least one bond pad; and
   at least one wirebond electrically connecting the at least one bond pad and a contact pad on the substrate.

2. The light emitting device as claimed in claim 1, wherein the light emitting diode die comprises a blue light emitting diode die.

3. The light emitting device as claimed in claim 1, wherein the light emitting diode die is a vertically arranged LED having a cathode on the top surface of an active region and an anode on the bottom of the active region.

4. The light emitting device as claimed in claim 1, wherein the light emitting diode die is a horizontally arranged LED having both a cathode and an anode on the top surface of an active region and an insulation base on the bottom of the active region.

5. The light emitting device as claimed in claim 4, further comprising a reflector underlying the insulation base.

6. The light emitting device as claimed in claim 1, wherein the luminescent material layer comprises phosphor particles that convert light of a wavelength emitted by the light emitting diode die to at least another wavelength.

7. The light emitting device as claimed in claim 6, wherein the phosphors comprise yttrium aluminum garnet doped with gadolinium and cerium.

8. The light emitting device as claimed in claim 1, wherein the light emitting diode die emits blue light, and wherein the luminescent material layer includes phosphors that convert a portion of the blue light to light combinable with a remaining portion of the blue light to produce white light.

9. The light emitting device as claimed in claim 1, further comprising an optical element encapsulating the light emitting device.

10. The light emitting device as claimed in claim 1, wherein the light emitting diode die comprises an electrode pattern on the top surface of the light emitting diode die.

11. The light emitting device as claimed in claim 1, wherein the luminescent material layer comprises a trench region connecting to the at least one opening.

* * * * *